United States Patent
Lutz et al.

(10) Patent No.: US 9,070,571 B2
(45) Date of Patent: Jun. 30, 2015

(54) POWER SWITCHING MODULE WITH REDUCED OSCILLATION

(71) Applicant: Infineon Technologies AG, Neubiberg (DE)

(72) Inventors: Josef Lutz, Chemnitz (DE); Hans-Joachim Schulze, Taufkirchen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/837,884

(22) Filed: Mar. 15, 2013

(65) Prior Publication Data

US 2014/0264376 A1 Sep. 18, 2014

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/423 | (2006.01) |
| H01L 29/74 | (2006.01) |
| H01L 31/111 | (2006.01) |
| H01L 29/45 | (2006.01) |
| H01L 27/06 | (2006.01) |
| H01L 29/16 | (2006.01) |
| H01L 29/66 | (2006.01) |
| H01L 29/417 | (2006.01) |
| H01L 29/739 | (2006.01) |
| H01L 29/08 | (2006.01) |

(52) U.S. Cl.
CPC ........ *H01L 27/0664* (2013.01); *H01L 29/1608* (2013.01); *H01L 29/66333* (2013.01); *H01L 2924/0002* (2013.01); *H01L 27/0629* (2013.01); *H01L 29/417* (2013.01); *H01L 29/7396* (2013.01); *H01L 29/0834* (2013.01)

(58) Field of Classification Search
CPC ............ H01L 27/0664; H01L 29/1608; H01L 29/66333
USPC .......... 257/124, 133, 146, 341, 401, E25.024, 257/E45.001
See application file for complete search history.

(56) References Cited

U.S. PATENT DOCUMENTS

| | | | | |
|---|---|---|---|---|
| 4,110,775 | A * | 8/1978 | Festa | 257/484 |
| 5,294,843 | A | 3/1994 | Tursky et al. | |
| 6,967,374 | B1 * | 11/2005 | Saito et al. | 257/341 |
| 6,998,678 | B2 * | 2/2006 | Werner et al. | 257/334 |
| 8,004,806 | B2 * | 8/2011 | Li | 361/58 |
| 8,541,787 | B2 * | 9/2013 | Zhang | 257/77 |
| 8,541,837 | B2 * | 9/2013 | Hirler | 257/331 |
| 8,618,598 | B2 * | 12/2013 | Haeberlen et al. | 257/329 |
| 8,629,509 | B2 * | 1/2014 | Ryu et al. | 257/378 |

(Continued)

FOREIGN PATENT DOCUMENTS

DE 4135259 C1 1/1993

*Primary Examiner* — Ida M Soward
(74) *Attorney, Agent, or Firm* — Murphy, Bilak & Homiller, PLLC (57) ABSTRACT

A power switching module includes a three-terminal power semiconductor device designed for a rated current and a freewheeling unit. The freewheeling unit includes a pn-diode integrated in a first semiconductor material having a first band-gap, and a Schottky-diode integrated in a second semiconductor material having a second band-gap that is larger than the first band-gap. The Schottky-diode is electrically connected in parallel to the pn-diode.

26 Claims, 5 Drawing Sheets

(56) References Cited

U.S. PATENT DOCUMENTS 8,643,345 B2 * 2/2014 Morimoto .................... 323/207
2007/0158680 A1 * 7/2007 Ozeki et al. ................... 257/146
2008/0315248 A1 * 12/2008 Tokura et al. ................. 257/139

* cited by examiner

POWER SWITCHING MODULE WITH REDUCED OSCILLATION

TECHNICAL FIELD

Embodiments described herein relate to power switching modules with reduced oscillation and to methods for manufacturing a power switching module.

BACKGROUND

Freewheeling diodes are used to protect power semiconductor devices against voltage spikes which occur when the power semiconductor device switches inductive loads. When suddenly disconnecting the inductive load from a current supply by turning off the active device, the magnetic energy stored in the inductive load induces a high voltage due to the sudden change of the current. A freewheeling diode provides a conductive path to carry the current driven by the inductive load which eases the current change and prevents the voltage peak caused by induction from appearing at the power semiconductor device.

Typically, pn-diodes are used as freewheeling diodes. From a perspective of reducing switching losses, Schottky-diodes provide an alternative to pn-diodes since Schottky-diodes allow for faster switching due to significantly smaller amounts of stored charge in comparison to pn-diodes.

However, the fast switching of Schottky-diodes when used as freewheeling diodes for IGBTs, for example, causes strong oscillations during switching. The oscillations lead to unwanted electronic noise. To reduce such oscillations, the switching speed, i.e. the rate di/dt with which the IGBTs are switched, can be reduced. This, however, increases the switching losses within the IGBT.

In view of the above, there is a need for improvement.

SUMMARY

According to an embodiment, a power switching module includes a three-terminal power semiconductor device designed for a rated current, and a freewheeling unit. The freewheeling unit includes a pn-diode integrated in a first semiconductor material having a first band-gap, and a Schottky-diode integrated in a second semiconductor material having a second band-gap that is larger than the first band-gap. The Schottky-diode is electrically connected in parallel to the pn-diode. The pn-diode is operable to have a reverse peak current at the rated current of the power semiconductor device which is from about 0.5 to about 1.8 of a capacitive current peak of the Schottky-diode.

According to an embodiment, a power switching module includes a three-terminal power semiconductor device, and a freewheeling unit. The freewheeling unit includes a pn-diode integrated in a first semiconductor material having a first band-gap, and a Schottky-diode integrated in a second semiconductor material having a second band-gap that is larger than the first band-gap. The Schottky-diode is electrically connected in parallel to the pn-diode. The pn-diode has a total pn-junction area, and the Schottky-diode has a total Schottky-junction area, and a ratio between the total pn-junction area and the total Schottky-junction area is from about 0.08 and 0.3. A ratio between a current through the pn-diode and a current through the Schottky-diode is from about 0.05 and 0.25 for a given total current through the pn-diode and the Schottky-diode.

According to an embodiment, a power switching module includes a three-terminal power semiconductor device and a freewheeling unit. The freewheeling unit includes a pn-diode integrated in a first semiconductor material having a first band-gap, an inductor electrically connected in series with the pn-diode, and a Schottky-diode integrated in a second semiconductor material having a second band-gap that is larger than the first band-gap. The Schottky-diode is electrically connected in parallel to the pn-diode and the inductor.

According to an embodiment, a method for manufacturing a power switching module includes providing a three-terminal power semiconductor device having a rated current; providing a Schottky-diode integrated in a second semiconductor material having a second band-gap; providing a pn-diode integrated in a first semiconductor material having a first band-gap which is smaller than the second band-gap, wherein the pn-diode has a reverse peak current at the rated current of the power semiconductor device which is from about 0.5 to about 1.8 of a capacitive current peak of the Schottky-diode; electrically connecting the Schottky-diode in parallel to the pn-diode to form a freewheeling unit; and electrically connecting the freewheeling unit to the three-terminal power semiconductor device to form the power switching module.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 7A illustrates the electrical symbol for the module shown in FIG. 7B, which illustrates an integrated power switching module according to an embodiment, where the pn-diode is integrated into the three-terminal device

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describe an ohmic connection between two elements.

Figure 1:
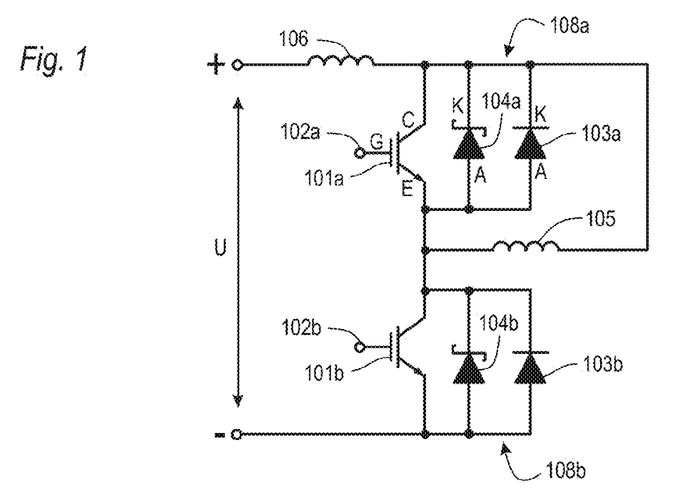
FIG. 1 illustrates a power switching module according to an embodiment.

An embodiment is described next with reference to FIG. 1. FIG. 1 illustrates a half-bridge which is a power switching module for switching an inductive load such as a motor. The inductive load is illustrated at 105. Two three-terminal power semiconductor devices 101a and 101b are connected in series. In the present embodiment, the three-terminal power semiconductor devices 101a and 101b are insulated gate bipolar transistors each having a gate terminal 102a, 102b, an emitter terminal and a collector terminal. The emitter terminals and collector terminals are illustrated at E and C, respectively. In a further embodiment, the three-terminal power semiconductor devices 101a and 101b are MOSFETs. In the following, the three-terminal power semiconductor devices 101a and 101b are referred to as first and second IGBT 101a and 101b, respectively.

A freewheeling unit is connected anti-parallel to each of the first and second IGBT 101a and 101b. Each freewheeling unit includes at least one pn-diode 103a, 103b integrated in a first semiconductor material, and at least one Schottky-diode 104a, 104b integrated in a second semiconductor material. The first semiconductor material has a first band-gap and the second semiconductor material has a second band-gap larger than the first band-gap. According to an embodiment, the first semiconductor material is silicon and the second semiconductor material is silicon carbide. Accordingly, the pn-diode 103a, 103b is a Si pn-diode and the Schottky-diode 104a, 104b is a SiC Schottky-diode. In each freewheeling unit, the respective Schottky-diode 104a, 104b is electrically connected in parallel to the pn-diode 103a, 103b. The pn-diode provides a charge, flowing as tail current, to damp oscillations caused by the capacitive behavior of the Schottky-diode.

The embodiment shown in FIG. 1 includes two three-terminal power semiconductor devices 101a, 101b, and two freewheeling units 108a, 108b, wherein a respective one of the freewheeling units 108a, 108b is electrically connected anti-parallel to a respective one of the three-terminal power semiconductor devices 101a, 101b. The number of power semiconductor devices and freewheeling units 108a, 108b is not limited to two. For example, a full-bridge includes four power semiconductor devices and four freewheeling units 108a, 108b.

The pn-diode 103a, 103b can be a pin-diode having a highly doped anode region in contact with a lowly doped or intrinsic drift region to form a pn-junction, and a highly doped cathode region in ohmic contact with the lowly doped or intrinsic drift region. The pn-diode 103a, 103b is described in more detail further below.

Assume, for example, that the first IGBT 101a is conductive and the second IGBT 101b is in a blocking mode. The voltage U of the voltage source then mainly drops over the second IGBT 101b. Neglect that a small voltage drop also occurs in the forward mode of the first IGBT 101a. The current i thus flows from the voltage source (from plus to minus) through the first IGBT 101a to the conductive load 105.

During switching, the first IGBT 101a is brought into a blocking state while the second IGBT 101b is made conductive. The inductive load 105 will then be connected with the positive pole of the voltage source which means that the current through the conductive load 105 flows. As well known, an inductivity "acts" against any change of the current flowing through it and tries to keep the current flowing. Any change of current, i.e. di/dt, leads to a generation of a voltage according to equation (1):

$$u_L = L \frac{di}{dt} \tag{1}$$

Hence, the change of the current i through the inductive load 105 induces a voltage $u_L$ over the inductive load 105 which actually tries to drive the current. Without any freewheeling diodes, there would be no electrical path for the current driven by the inductive load 105 and the induced voltage $u_L$, which could be higher than the rated blocking voltage of the IGBTs, would drop over the second IGBT 101b and may destroy the second IGBT 101b.

The freewheeling units 108a, 108b including the diodes 103a, 103b, 104a, 104b provide a path for the current driven by the inductive load 105. If the load 105 is parallel to the unit 108a, 108b acts as a freewheeling path for the current driven by the load 105. In this case, when the first IGBT 101a is brought from a conductive state to a blocking state, the current "commutates" from the first IGBT 101a to the freewheeling diodes 103b and 104b. This avoids generation of a high voltage over the first IGBT 101a.

During switching of the inductive load 105, transient oscillations may occur due to the LC resonator formed by the capacitances of the pn-diode 103a, the capacitance of the Schottky-diodes 104a, and the stray inductivity 106 formed by the electrical connections between the electronic elements illustrated in FIG. 1. If the load 105 is parallel to the diodes 103b, 104b, the same holds.

To avoid or reduce these oscillations, the pn-diode 103a, 103b is operable to have a reverse peak current at the rated current of the IGBTs 101a, 101b which is about 0.5 to about 1.8 of the capacitive current peak of the Schottky-diode 104a, 104b. In an embodiment, the reverse peak current of the pn-diode 103a, 103b is about 0.7 to about 1.5 of the capacitive current peak of the Schottky-diode. The capacitive current peak of a Schottky-diode can be calculated based on the area-specific capacity $c_j$, which is given in equation (2). The subscript j denotes that this is the capacity of the metal-semiconductor junction:

$$c_j = \sqrt{\frac{q \cdot \varepsilon \cdot N_D}{2 \cdot (V_j + V_r)}} \tag{2}$$

with q being the elementary charge, $N_D$ the doping concentration in the drift region of the Schottky-diode, $\epsilon$ the permittivity, $V_j$ the junction voltage of the metal-semiconductor junction of the Schottky-diode, and $V_r$ the applied voltage. The doping concentration $N_D$ in SiC can be larger by about a factor of 100 in comparison with the doping concentration $N_D$ in Si. The area-specific capacity $c_j$ has its maximum when $V_r$ is zero. This leads to $$c_j(0 \text{ V}) = \sqrt{\frac{q \cdot \varepsilon \cdot N_D}{2 \cdot V_j}} \quad (3)$$

To calculate the capacity $C_j(0V)$, the area-specific capacity $c_j(0V)$ is multiplied by the total junction area A of the Schottky-junction according to equation (4):

$$C_j(0V) = c_j(0V) \cdot A \quad (4)$$

Figure 9:
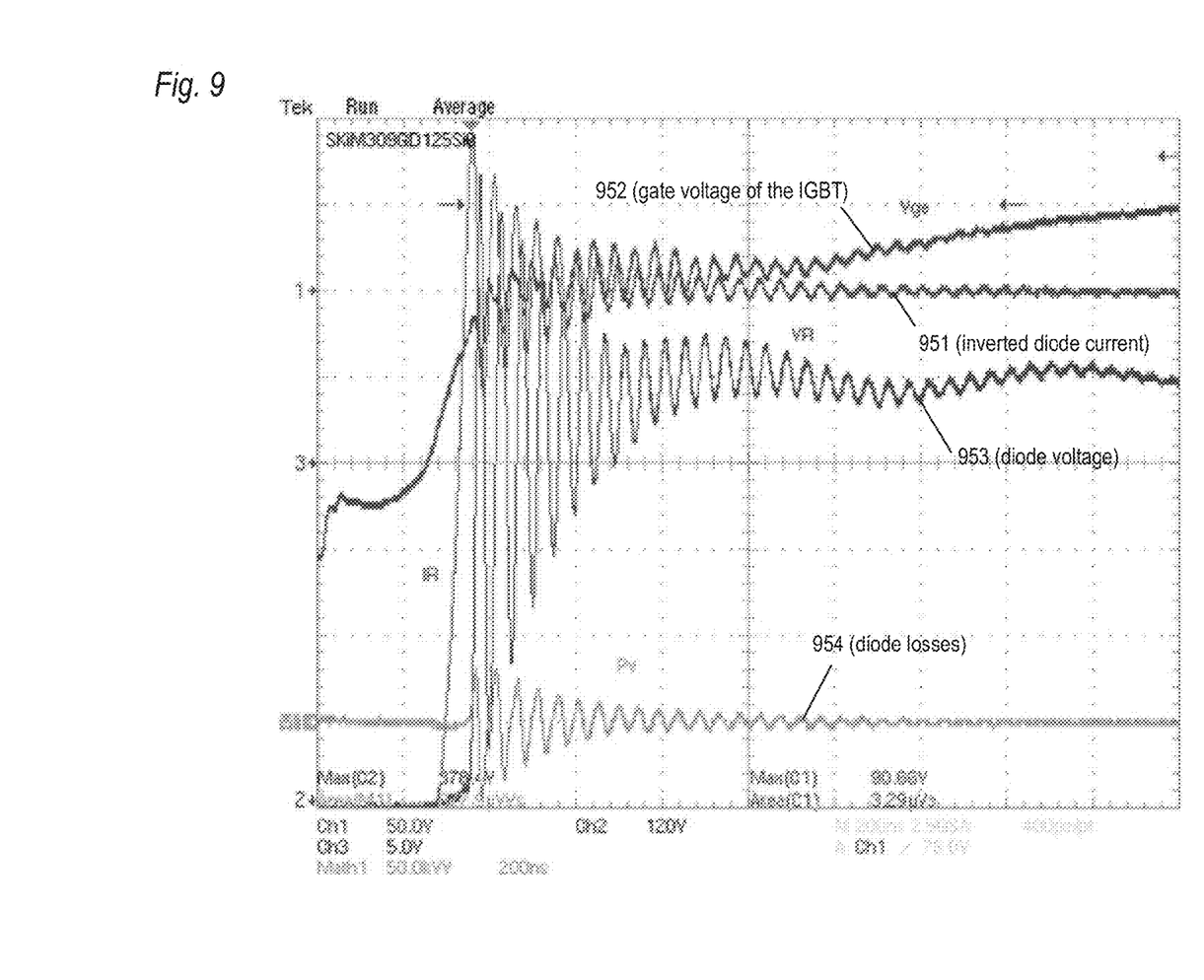
FIG. 9 illustrates the oscillation behavior during switching of an IGBT with Schottky-diodes.

The value $C_j(0V)$ is a characteristic value for each Schottky-diode and typically given in the data sheet of commercially available Schottky-diodes. The current peak $I_{d,\,peak}$ caused by the capacity of the Schottky-diode is given according to equation (5):

$$I_{D,\,\text{peak}} = C_j(0 \text{ V}) \cdot \frac{du}{dt} \quad (5)$$

with du/dt being the variation of the voltage over the Schottky-diode. The variation du/dt is typically determined or controlled by the actual switching application and the IGBT used to switch the voltage. In the following, an example is given based on FIG. 9.

FIG. 9 illustrates an example where only a Schottky-diode is used as the freewheeling diode. Schottky-diodes allow a fast switching but cause strong oscillation when switching at high rate. The voltage over the Schottky-diode (120V/div) is illustrated at 953 while the inverted diode current of the Schottky-diode (50 A/div) is illustrated at 951. This leads to the losses of the Schottky-diode illustrated at 954. The gate voltage of the IGBT (5V/div) is illustrated at 952.

As can be deduced from FIG. 9, du/dt is about 30V/ns. The Schottky-diode used for the measurement illustrated in FIG. 9 had a capacity $C_j(0V)$ of about 754 pF which gave a current peak $I_{d,\,peak}$ of about 90.48 A which correlates with the measured results.

According to an embodiment, the pn-diode 103a, 103b of each freewheeling unit 108a, 108b is connected in parallel to the Schottky-diode 104a, 104b of the respective freewheeling unit 108a, 108b. The pn-diode 103a, 103b damps the oscillation due to its soft-recovery behavior. According to an embodiment, the pn-diode 103a, 103b is operable to have a reverse peak current $I_{RPM}$ which is about 0.5 to about 1.8, in some embodiments between about 0.7 to about 1.5, of the capacitive current peak $I_{d,\,peak}$ of the Schottky-diode according to equation (6):

$$I_{RRM} = 0.5 \ldots 1.8 \cdot I_{D,peak} \quad (6)$$

When configuring the pn-diode 103a, 103b such that it allows a reverse peak current $I_{RPM}$ in the above given range relative to the capacitive current peak $I_{d,\,peak}$ of the Schottky-diode, oscillations can be significantly reduced without increasing the switching losses. The pn-diode 103a, 103b of the freewheeling unit 108a, 108b provides a so-called tail-current which damps the oscillation. The tail-current is the result of the switching behavior of the pn-diode 103a, 103b.

For example, when switching on the pn-diode 103a, 103b to a conductive state, the current does not immediately rise to the steady-state current as the pn-junction must first be flooded with charge carriers. Similarly, when turning off the pn-diode 103a, 103b, the charge carriers stored in the pn-diode 103a, 103b must be removed before the pn-diode 103a, 103b can take up the blocking voltage. Hence, there will be a given "recovery" time for the pn-diode 103a, 103b during which a tail-current is flowing during turn-off.

Although a pronounced tail-current can increase the total losses of the switching module, an increase of the loss can be limited when adjusting the reverse peak current $I_{RPM}$ of the pn-diode 103a, 103b as given above. This is the case when using IGBTs as power semiconductor devices.

To provide the pn-diode 103a, 103b with appropriate damping characteristics without increasing the losses, a ratio between a current through the pn-diode 103a, 103b and a current through the Schottky-diode 104a, 104b is set to be between about 0.05 and 0.25 for a given total current through the pn-diode 103a, 103b and the Schottky-diode 104a, 104b, according to an embodiment. Hence, the portion of the current carried by the pn-diode 103a, 103b is about 5% to about 25% of the current carried by the Schottky-diode 104a, 104b.

Furthermore, the pn-diode 103a, 103b can carry about 25% of the total current at rated current. The reverse peak current $I_{RPM}$ may also be dependent on the switching slope di/dt of the IGBT, which switching slope is set to be comparably high. For example, the switching slope di/dt can be in the range of about 1250 A/μs for a pn-junction area of the pn-diode 103a, 103b of about 0.25 cm².

An option to adjust the current ratio is to provide the pn-diode 103a, 103b and the Schottky-diode 104a, 104b with an appropriate area ratio. According to an embodiment, the pn-diode 103a, 103b has a given total pn-junction area and the Schottky-diode 104a, 104b has a given total Schottky-junction area. The ratio between the total pn-junction area of the pn-diode 103a, 103b and the total Schottky-junction area of the Schottky-diode 104a, 104b is between about 0.08 and about 0.3.

The total junction area of the respective diodes defines the cross-section of the respective devices through which current can flow. For example, when a diode includes a plurality of cells, the sum of the junction area of all cells corresponds to the total junction area of the diode.

Figure 8A:
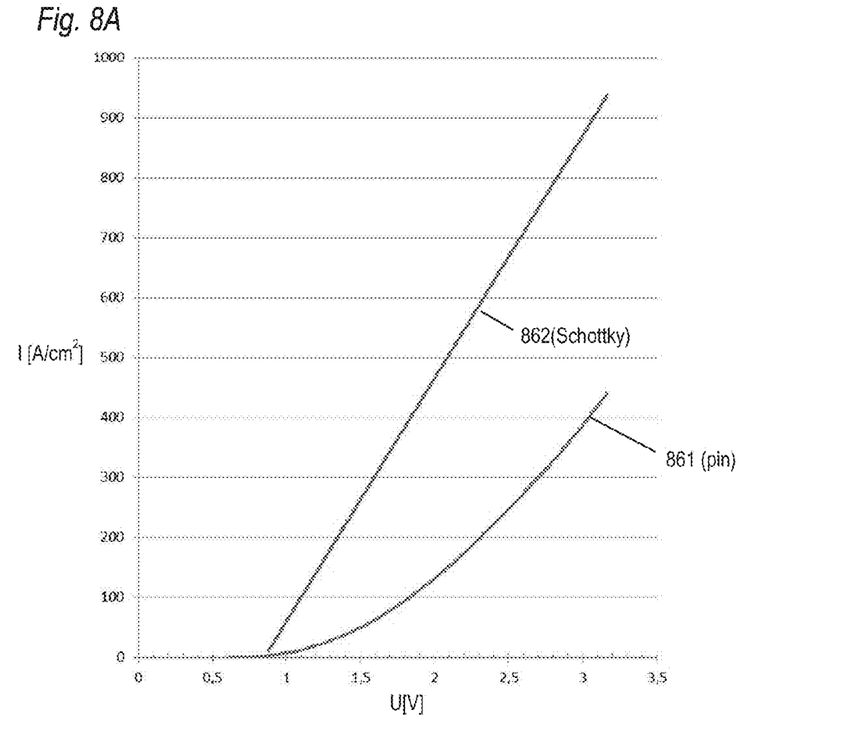
FIG. 8A illustrates the forward characteristic of a pn-diode and a Schottky-diode according to an embodiment.
Figure 8B:
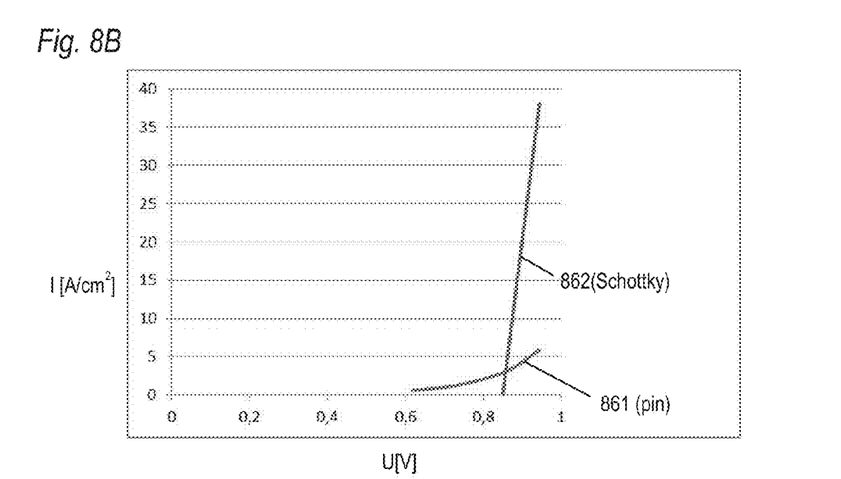
FIG. 8B illustrates an enlarged view of a section of FIG. 8A.

FIG. 8A illustrates a specific example with 862 indicating the characteristic of a SiC-Schottky-diode and 861 indicating the characteristic of a Si pin-diode, while FIG. 8B illustrates an enlarged section of FIG. 8A in the range of 0 V to 1 V. The Si pin-diode includes an intrinsic region between the anode and the cathode and is an example of pn-diodes which can be used as freewheeling diodes. The principle characteristic illustrated in FIGS. 8A and 8B for the pin-diode is also valid for pn-diodes. The term "pn-diode" is used here for pn-diodes and pin-diodes. Typically, power pn-diodes are of pin type where "i" refers to a lowly doped n-layer also denoted as base layer.

At a rated current of about 400 A/cm², the pin-diode carries about 100 A/cm² Both the SiC-Schottky-diode and the pin-diode have a rated blocking voltage of 1200 V. The threshold voltage of the SiC-Schottky-diode is about 0.85 V and the threshold voltage of the pin-diode is about 0.7 V. Hence, at voltages lower than the threshold voltage of the SiC-Schottky-diode, the pin-diode carries the total current. Furthermore, the pin-diode will be flooded even at a low current so that the damping effect of the pin-diode is particularly pronounced during the initial phase of the switching.

Figure 2:
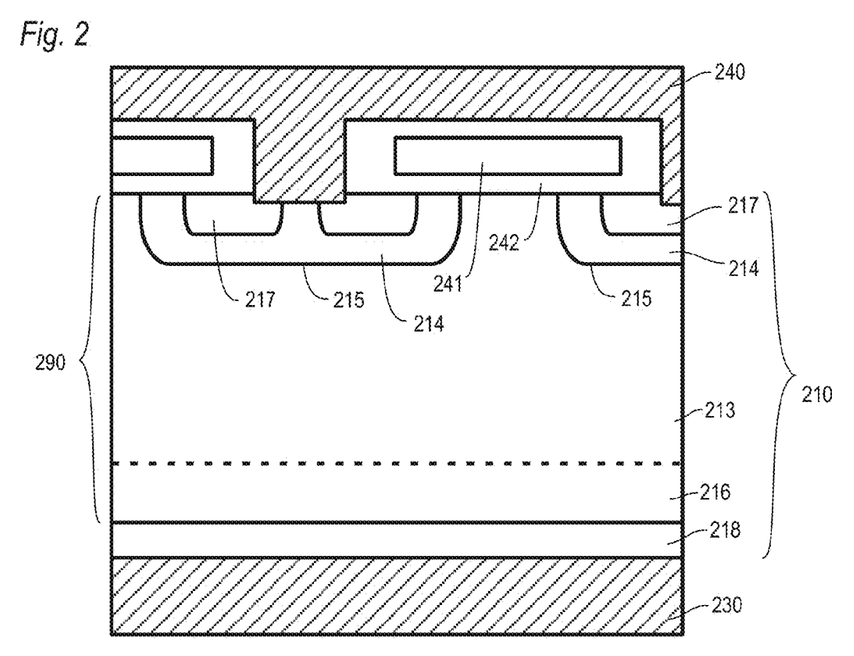
FIG. 2 illustrates an IGBT used as a three-terminal power semiconductor device according to an embodiment.

An IGBT suitable as a power switching device is illustrated in FIG. 2. The IGBT is formed in a semiconductor body 210 which can include a monocrystalline substrate layer 218 and an epitaxial region 290 formed on the monocrystalline substrate layer 218. The monocrystalline substrate layer 218 forms here a p-doped emitter region 218. The epitaxial region 290 includes a lowly n-doped drift or base region 213 and an optional field-stop region 216 between the drift region 213 and the emitter region 218. The field-stop region 216 is also n-doped but has a higher doping concentration than the drift or base region 213. P-doped p-body regions 214 and highly n-doped source regions 217 are diffused into the drift or base region 213. The body regions 214 form pn-junctions 215 with the drift or base region 213. On the epitaxial layer 290 and above the p-body regions 214, gate electrodes 241 are provided which are insulated from the epitaxial layer 290 by a gate dielectric 242.

According to an embodiment, instead of using epitaxial processes for the manufacturing of the n-doped drift or base region 213, it is also possible to use a high-resistivity semiconductor substrate, which is thinned from the wafer backside after the completion of the front side processes, e.g. formation of the source regions 217 and body regions 214. After the thinning processes, the backside emitter region 218 and the optional field-stop layer 216 are processed, e.g. by ion implantation and annealing processes.

The p-body regions 214 and the source regions 217 are electrically connected with a first metallization 240 forming here an emitter terminal. The emitter region 218 is in electrical contact with a metal layer 230 which provides here a collector terminal of the IGBT.

Figure 3:
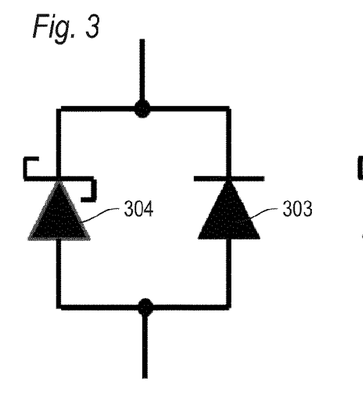
FIG. 3 illustrates a freewheeling unit according to an embodiment.

FIG. 3 illustrates a freewheeling unit according to an embodiment which includes a single pn-diode 303 and a single Schottky-diode 304 which are electrically connected parallel with each other. As the pn-diode 303 and the Schottky-diode 304 are integrated into different semiconductor materials, both are typically separate components, which can be combined in the power switching module.

Figure 4:
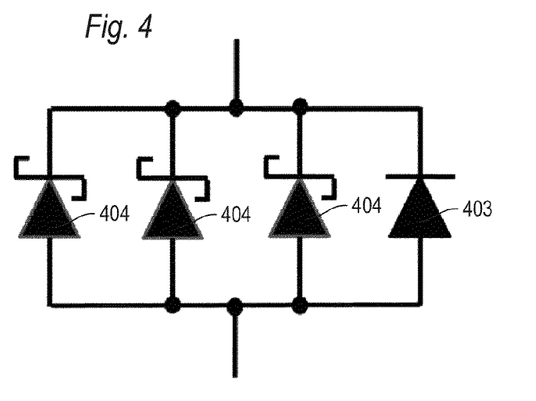
FIG. 4 illustrates a freewheeling unit according to an embodiment.

FIG. 4 illustrates a freewheeling unit according to an embodiment which includes a single pn-diode 403 and three Schottky-diodes 404 which are all electrically connected parallel with each other. Separate SiC Schottky-diodes 404 allows easy adjustment of the ratio of the total pn-junction area of the pn-diode 403 to the total Schottky-junction area of the Schottky-diodes 404. For example, the sum of the Schottky-junction areas of the three Schottky-diodes 404 defines the total Schottky-junction area of the Schottky-diode as given above. The three Schottky-diodes 404 together thus form the Schottky-diode of the freewheeling unit.

Combining separate small Schottky-diodes 404 also prevents that a single large Schottky-diode is required. Since SiC is difficult to process, a large area Schottky-diode is usually more expensive than a group of smaller SiC Schottky-diodes providing the same total Schottky-junction area as the one large Schottky-diode. This also facilitates replacement of defect diodes and allows easier scaling. It should be mentioned here that the number of the Schottky-diodes 404 and the pn-diodes 403 is not limited to the values given here but can be any value.

Figure 5:
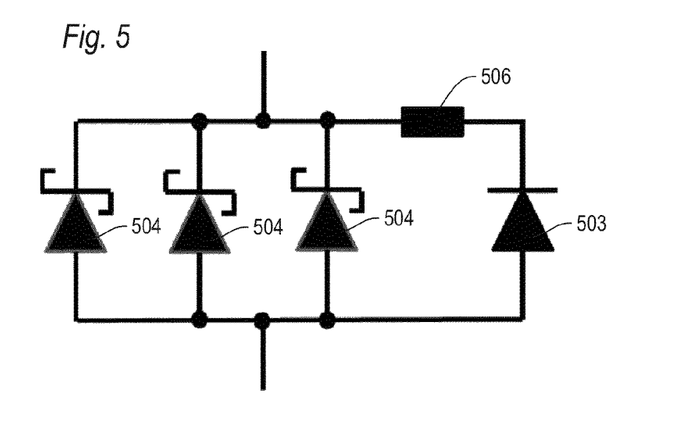
FIG. 5 illustrates a freewheeling unit according to an embodiment.

FIG. 5 illustrates a freewheeling unit according to an embodiment which includes a single pn-diode 503 and an inductor 506 which are electrically connected in series with each other. The freewheeling unit further includes a plurality of Schottky-diodes 504, for example three Schottky-diodes 504 as illustrated in FIG. 5. Each of the Schottky-diodes 504 is electrically connected parallel with the inductor 506 and the diode 503. The inductor 506 provides a further option to adapt the switching behavior of the pn-diode 503 and thus the reduction of the oscillations. For example, the steepness of the commutation, i.e. di/dt, can be further reduced by the inductor 506 so that commonly used pn-diodes 503 can be used even when the recovery characteristics are not within the above give range.

The inductor 506 can be a lumped element. The inductor 506 can also be formed by a portion of the electrical connection between or within the freewheeling unit. For example, using longer bond wires can be sufficient for particular applications. A bond wire having a length of about 1 cm has an inductivity of about 10 nH. Adapting the length of the bond wire in the pn-diode branch of the freewheeling unit leads to a different steepness of the commutation di/dt in the pn-diode branch of the freewheeling unit.

Bond wires can also be used in the Schottky-diode branch of the freewheeling unit. According to an embodiment, the length of a bond wire in the Schottky-diode branch of the freewheeling unit is different than the length of a bond wire in the pn-diode branch of the freewheeling unit to provide both branches with different steepness of the commutation. For example, the length of a first bond wire electrically connected with the Schottky-diode is 30% to 200% of the length of a second bond wire electrically connected with the pn-diode. For example, the steepness of the commutation di/dt in the pn-diode branch can be reduced by a factor of about 2 using a different length of bond wires, for example by providing a bond wire in the pn-diode branch which is longer than a bond wire in the Schottky-diode branch.

The soft-recovery behavior of the pn-diode and the amplitude of the tail-current can also be adjusted, for example, by adapting the thickness of the semiconductor material, the doping profile of a field-stop region, or the life-time of the charge carriers. Examples will be explained in connection with the following embodiments.

Figure 6:
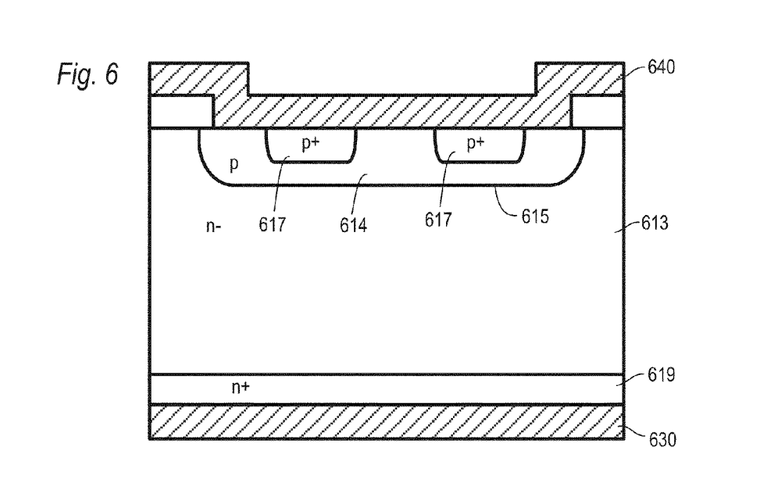
FIG. 6 illustrates a pn-diode used in a freewheeling unit according to an embodiment.

FIG. 6 illustrates an embodiment of a pn-diode integrated into a semiconductor substrate such as silicon. The semiconductor substrate includes a highly n-doped cathode region 619 in contact with a lowly n-doped drift or base region 613. The drift or base region 613 can also be an intrinsically doped region. A p-doped anode region 614 is diffused into the drift or base region 613 and forms a pn-junction 615 with the drift or base region 613. An optional field-stop region can be formed in the drift or base region 613 close to the cathode region 619 in a similar manner as described in connection with FIG. 2. The cathode region 619 is in electrical contact with a cathode metallization 630 while the anode region 614 is in electrical contact with an anode metallization 640.

Doped regions 617, which are higher doped than the anode region 614, can be integrated into the anode region 614 to adjust the emitter efficiency of the anode region 614. Controlling the emitter efficiency is one option to adjust the charge carrier distribution within the drift or base region 613 during the conductive state which directly influences the recovery behavior of the pn-diode.

The above described measure can be combined with life-time adjustment measures such as implantation of recombination centers.

An example is subsequently described. To adapt the charge carrier life-time, helium ions can be implanted into the anode region 614, combined with an electron irradiation in the base 613 and a subsequent annealing process at temperatures which are typically in the range from about 250° C. to about 380° C. Another option is the implantation of platinum or gold, which are typically implanted into the drift or base region 613 with a subsequent annealing process at temperatures which are typically in the range from about 700° C. to about 900° C. Irrespective of the actual implantation, the recombination centers formed by the implanted impurities can have a given vertical doping profile to locally adjust the carrier lifetime.

Recombination centers allow a very fine control of various electrical parameters of pn-diodes. Particularly the reverse peak current $I_{RPM}$ can be adjusted by introducing recombination centers so that the reverse peak current $I_{RPM}$ can be easily tuned to be in the above given range relative to the capacitive current peak $I_{d, peak}$ of the Schottky-diode.

For example, the dose of helium implantation for a soft recovery diode can be about $7*10^{11}$ cm$^{-2}$. For higher $I_{RRM}$, the dose can be decreased, e.g. to a value of $2*10^{11}$ cm$^{-2}$ to $4*10^{11}$ cm$^{-2}$. For lower $I_{RRM}$, the dose can be increased to the range $9*10^{11}$ cm$^{-2}$ to $1.7*10^{12}$ cm$^{-2}$, if the annealing conditions are the same. A further possibility is to keep the dose of the helium implantation constant and to vary the annealing conditions. Lower annealing temperature will decrease $I_{RRM}$. Higher annealing temperature will increase $I_{RRM}$, and, if electron irradiation is used for the carrier lifetime adjustment in the base 613, this provides a more pronounced and more damping tail current.

The concentration of the recombination centers is typically set such that the carrier life-time values in the region containing the recombination centers are in a range, e.g., from about 100 ns to about 10 µs.

Figure 7A:
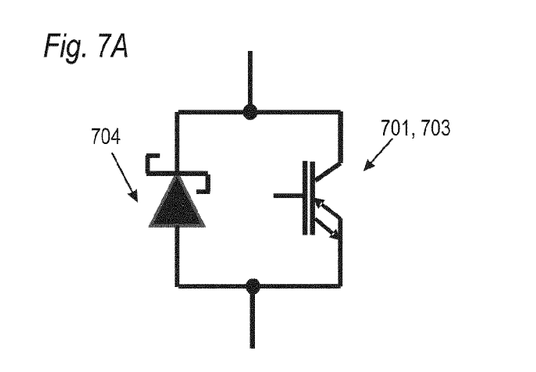
Figure 7B:
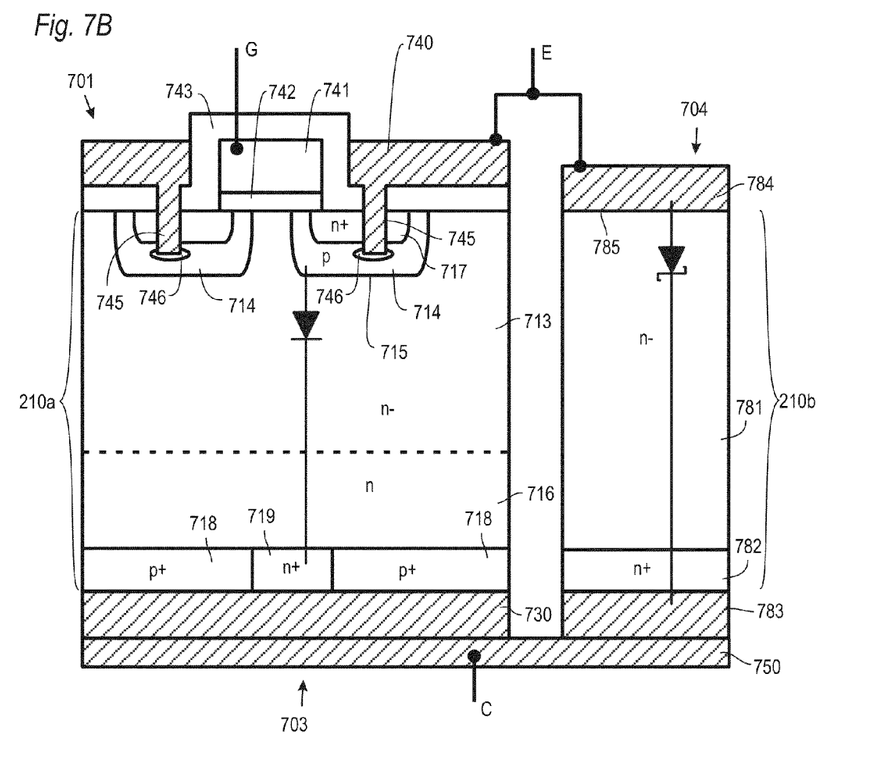

FIGS. 7A and 7B illustrate an integrated power switching module according to an embodiment. FIG. 7B illustrates the structure while FIG. 7A illustrates the electrical symbol. The module includes at least one three-terminal power semiconductor device 701, embodied here as IGBT 701, and at least one pn-diode 703 which are both integrated in the same semiconductor substrate 210a, which is referred to as first semiconductor substrate 210a. The IGBT 701 has a similar arrangement as the one illustrated in FIG. 2 and includes a highly p-doped emitter region 718, a weakly n-doped drift or base region 713, and an n-doped field-stop region 716 which has a higher doping concentration than the drift or base region 713 and which is arranged between the emitter region 718 and the drift region 713. P-doped body regions 714 forming pn-junctions 715 with the drift or base region 713 are integrated into the drift or base region 713, and highly n-doped source regions 717 are integrated into the body regions 714.

An emitter metallization 740 is formed on the upper surface of the first semiconductor substrate 210a. The emitter metallization 740 is in ohmic contact with the source regions 717 and body regions 714 through contact plugs 745. To improve the ohmic contact with the body regions 714, highly p-doped contact regions 746 are formed at the bottom of the contact plugs 745. A collector metallization 730 is in ohmic contact with the emitter region 718.

Gate electrodes 741 insulated from the body regions 714 by respective gate dielectric layers 742 are provided to allow formation of inversion channels between the source regions 717 and the drift region 713. A thick insulating layer 743 insulates the gate electrodes 741 from the emitter metallization 740.

As illustrated in FIG. 7B, the pn-diode 703 is integrated into the IGBT 701 by providing a highly n-doped cathode region 719 which provides an ohmic contact between the collector metallization and the field-stop region 716. The anode of the pn-diode 703 is formed by the body regions 714 which are in ohmic contact with the emitter metallization 740 through the contact plugs 745 and the contact regions 746.

Separate to the first semiconductor substrate 210a, a second semiconductor substrate 210b is provided in which a Schottky-diode 704 is integrated. The second semiconductor substrate 210b is comprised of a different semiconductor material than the first semiconductor substrate 210a. In the present embodiment, the first semiconductor material is silicon and the second semiconductor material is SiC without being limited thereto.

The Schottky-diode 704 includes a highly n-doped cathode region 782 and a weakly n-doped drift or base region 781. The drift region 781 is in contact with an anode metallization 784 and forms a metal-semiconductor junction 785. The cathode region 782 is in ohmic contact with a cathode metallization 783.

Both the Schottky-diode 704 and the IGBT 701 with the integrated pn-diode 703 are arranged on a common conductive lead-structure 750 which electrically connects the collector metallization 730 with the cathode metallization 783 and which forms a common collector terminal C. This results in a lower inductance between the integrated pn-diode 703 and the Schottky-diode 704 and a higher reliability of the circuit. The anode metallization 784 and the emitter metallization 740 are also electrically connected with each other, for example by bond wires, forming a common emitter terminal E.

By implementation of an inductor between metallization 740 and the terminal E, the same effect as described with FIG. 5 can be achieved.

By adapting the total junction-area of the pn-diode 703 and the Schottky-diode 704, the above described relations can be set. For example, only a part of the total area of the IGBT can be implemented with n-doped cathode regions 719. This area then defines the pn-diode wherein a ratio between the total pn-junction area of the pn-diode and the total Schottky-junction area of the Schottky-diode is between about 0.08 and 0.3.

With a positive voltage $V_G$ at the gate terminal G, the $I_{RRM}$ of the integrated pn-diode can be fine-tuned. If such a signal is set before turn-off, the source region 717 will inject electrons and reduces the anode emitter efficiency of the diode. A very short instance $t_d$ before turn-off of the diode, the voltage $V_G$ is set to zero again. With adjusting $t_d$ between 1 ns and 10 µs, the $I_{RRM}$ can be tuned. The shorter $t_d$, the lower $I_{RRM}$.

While the above described embodiments have specific doping relations, this should not be regarded as being limiting. For example, reverse doping relations are also possible. For example, the drift regions, field-stop regions, the cathode regions, and the source regions can be p-doped while the body regions, the anode regions and emitter regions can be n-doped.

Furthermore, the semiconductor material can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide (Si—SiC) and SiGe graded heterojunction semiconductor material. For power semiconductor applications currently mainly Si, SiC and Si—SiC materials are used.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power switching module, comprising:
   a three-terminal power semiconductor device designed for a rated current; and
   a freewheeling unit comprising a pn-diode integrated in a first semiconductor material having a first band-gap, and a Schottky-diode integrated in a second semiconductor material having a second band-gap, wherein the second band gap is larger than the first band-gap, wherein the Schottky-diode is electrically connected in parallel to the pn-diode, and
   wherein the pn-diode is operable to have a reverse peak current at the rated current of the power semiconductor device which is from about 0.5 to about 1.8 of a capacitive current peak of the Schottky-diode.

2. The power switching module according to claim 1, wherein the three-terminal power semiconductor device is an insulated gate bipolar transistor.

3. The power switching module according to claim 2, wherein the freewheeling unit is connected anti-parallel to the insulated gate bipolar transistor.

4. The power switching module according to claim 1, wherein the first semiconductor material is silicon.

5. The power switching module according to claim 1, wherein the second semiconductor material is silicon carbide.

6. The power switching module according to claim 1, wherein the pn-diode comprises a pn-junction formed by a p-doped region and an n-doped region, and wherein the p-doped region comprises a higher density of recombination centers than the n-doped region.

7. The power switching module according to claim 6, wherein the recombination centers are formed by implanted helium ions.

8. The power switching module according to claim 6, wherein the recombination centers are formed by at least one of gold doping and platinum doping.

9. The power switching module according to claim 1, wherein the freewheeling unit further comprises an inductor which is connected in series with the pn-diode.

10. The power switching module according to claim 1, wherein the pn-diode comprises a pn-junction formed by a p-doped anode region and an n-doped drift region, wherein a highly p-doped region integrated in the p-doped anode region has a higher doping concentration than the p-doped anode region.

11. The power switching module according to claim 1, wherein the pn-diode has a total pn-junction area and the Schottky-diode has a total Schottky junction area, and wherein a ratio between the total pn-junction area and the total Schottky junction area is from about 0.08 to about 0.3.

12. The power switching module according to claim 1, wherein the pn-diode and the three-terminal power semiconductor device are integrated into a single semiconductor body.

13. The power switching module according to claim 1, further comprising:
   a first bond wire electrically connected with the Schottky-diode; and
   a second bond wire electrically connected with the pn-diode,
   wherein a length of the first bond wire is from about 30% to about 200% of a length of the second bond wire.

14. The power switching module according to claim 1, further comprising:
   a common conductive lead-structure which is electrically connected to a collector metallization of the power semiconductor device and to a cathode metallization of the Schottky-diode to form a common collector terminal of the power switching module.

15. A power switching module, comprising:
   a three-terminal power semiconductor device; and
   a freewheeling unit comprising a pn-diode integrated in a first semiconductor material having a first band-gap, and a Schottky-diode integrated in a second semiconductor material having a second band-gap, wherein the second band-gap is larger than the first band-gap, wherein the Schottky-diode is electrically connected in parallel to the pn-diode,
   wherein the pn-diode has a total pn-junction area,
   wherein the Schottky-diode has a total Schottky junction area,
   wherein a ratio between the total pn-junction area and the total Schottky-junction area is from about 0.08 to about 0.3, and
   wherein a ratio between a current through the pn-diode and a current through the Schottky-diode is from about 0.05 and 0.25 for a given total current through the pn-diode and the Schottky-diode.

16. The power switching module according to claim 15, wherein the three-terminal power semiconductor device is an insulated gate bipolar transistor.

17. The power switching module according to claim 16, wherein the freewheeling unit is connected anti-parallel to the insulated gate bipolar transistor.

18. The power switching module according to claim 15, wherein the pn-diode comprises a pn-junction formed by a p-doped region and an n-doped region, and wherein the p-doped region comprises recombination centers.

19. The power switching module according to claim 15, wherein the freewheeling unit further comprises an inductor which is connected in series with the pn-diode.

20. The power switching module according to claim 15, wherein the pn-diode comprises a pn-junction formed by a p-doped anode region and an n-doped drift region, wherein a highly p-doped region integrated in the p-doped anode region has a higher doping concentration than the p-doped anode region.

21. A power switching module, comprising:
a three-terminal power semiconductor device; and
a freewheeling unit comprising a pn-diode integrated in a first semiconductor material having a first band-gap, an inductor electrically connected in series with the pn-diode, and a Schottky-diode integrated in a second semiconductor material having a second band-gap, wherein the second band gap is larger than the first band-gap, and wherein the Schottky-diode is electrically connected in parallel to the pn-diode and the inductor.

22. The power switching module according to claim 21, wherein the pn-diode has a total pn-junction area and the Schottky-diode has a total Schottky-junction area, and wherein a ratio between the total pn-junction area and the total Schottky-junction area is from about 0.08 to about 0.3.

23. The power switching module according to claim 21, wherein the three-terminal power semiconductor device is an insulated gate bipolar transistor.

24. The power switching module according to claim 23, wherein the freewheeling unit is connected anti-parallel to the insulated gate bipolar transistor.

25. The power switching module according to claim 21, wherein the pn-diode comprises a pn-junction formed by a p-doped region and an n-doped region, and wherein the p-doped region comprises recombination centers.

26. The power switching module according to claim 21, wherein the pn-diode comprises a pn-junction formed by a p-doped anode region and an n-doped drift region, wherein an n-doped anode region that has a higher doping concentration than the n-doped drift region provides an ohmic contact between a cathode metallization and the n-doped drift region.

* * * * *

UNITED STATES PATENT AND TRADEMARK OFFICE
CERTIFICATE OF CORRECTION

PATENT NO. : 9,070,571 B2
APPLICATION NO. : 13/837884
DATED : June 30, 2015
INVENTOR(S) : J. Lutz et al.

Page 1 of 1

It is certified that error appears in the above-identified patent and that said Letters Patent is hereby corrected as shown below:

In the Claims

Column 11, line 34 (claim 1, line 8) please change "band gap is" to -- band-gap is --

Column 12, line 6 (claim 11, line 3) please change "Schottky junction" to -- Schottky-junction --

Column 12, line 8 (claim 11, line 5) please change "Schottky junction" to -- Schottky-junction --

Column 12, line 40 (claim 15, line 11) please change "Schottky junction" to -- Schottky-junction --

Column 13, line 8 (claim 21, line 8) please change "band gap" to -- band-gap --

Signed and Sealed this
Second Day of February, 2016

Michelle K. Lee
*Director of the United States Patent and Trademark Office*